(12) United States Patent
Tesson et al.

(10) Patent No.: US 11,332,411 B2
(45) Date of Patent: May 17, 2022

(54) METHOD FOR PRODUCING A CONSOLIDATED FIBER PREFORM

(71) Applicants: SAFRAN CERAMICS, Le Haillan (FR); SAFRAN, Paris (FR)

(72) Inventors: Thierry Guy Xavier Tesson, Moissy-Cramayel (FR); Maxime François Roger Carlin, Moissy-Cramayel (FR); Simon Thibaud, Moissy-Cramayel (FR); Rémy Dupont, Moissy-Cramayel (FR); Ramzi Bohli, Moissy-Cramayel (FR)

(73) Assignees: SAFRAN, Paris (FR); SAFRAN CERAMICS, Le Haillan (FR)

( * ) Notice: Subject to any disclaimer, the term of this patent is extended or adjusted under 35 U.S.C. 154(b) by 502 days.

(21) Appl. No.: 16/491,766

(22) PCT Filed: Mar. 5, 2018

(86) PCT No.: PCT/FR2018/050492
§ 371 (c)(1),
(2) Date: Sep. 6, 2019

(87) PCT Pub. No.: WO2018/162827
PCT Pub. Date: Sep. 13, 2018

(65) Prior Publication Data
US 2020/0370170 A1     Nov. 26, 2020

(30) Foreign Application Priority Data
Mar. 7, 2017 (FR) ..................................... 1700224

(51) Int. Cl.
*C04B 35/80* (2006.01)
*C23C 16/04* (2006.01)
(Continued)

(52) U.S. Cl.
CPC ................ *C04B 35/80* (2013.01); *B28B 1/52* (2013.01); *C04B 35/14* (2013.01); *C04B 35/18* (2013.01);
(Continued)

(58) Field of Classification Search
None
See application file for complete search history.

(56) References Cited

U.S. PATENT DOCUMENTS 5,246,736 A    9/1993   Goujard et al.
5,738,951 A    4/1998   Goujard et al.
(Continued)

FOREIGN PATENT DOCUMENTS

FR    3 039 149 A1    1/2017
RU    2 412 134 C1    2/2011
(Continued)

OTHER PUBLICATIONS

International Search Report as issued in International Patent Application No. PCT/FR2018/050492, dated Jun. 14, 2018.

*Primary Examiner* — Joel G Horning
(74) *Attorney, Agent, or Firm* — Pillsbury Winthrop Shaw Pittman LLP

(57) ABSTRACT

A method for producing a consolidated fiber preform intended for the manufacture of a part made of composite material, includes shaping a fiber texture in a heated metal mold, the texture being pre-impregnated with a transient or fugitive material, or shaping a fiber texture in a metal mold and injecting a transient or fugitive material into the fiber texture held in shape in the metal mold, cooling the mold, removing the set fiber preform from the mold, coating the fiber preform with a slurry containing a powder of ceramic or carbon particles, heat-treating the coated fiber preform so as to form a porous shell around the fiber preform by
(Continued)

consolidation of the slurry and so as to remove the transient or fugitive material present in the fiber preform, consolidating the fiber preform by gas-phase chemical infiltration.

10 Claims, 6 Drawing Sheets

(51) Int. Cl.
    *B28B 1/52*      (2006.01)
    *C04B 35/52*      (2006.01)
    *C04B 35/565*      (2006.01)
    *C04B 35/583*      (2006.01)
    *C04B 35/584*      (2006.01)
    *C04B 35/628*      (2006.01)
    *C23C 16/02*      (2006.01)
    *C04B 35/14*      (2006.01)
    *C04B 35/18*      (2006.01)
    *C04B 35/573*      (2006.01)

(52) U.S. Cl.
    CPC ............ *C04B 35/52* (2013.01); *C04B 35/565* (2013.01); *C04B 35/573* (2013.01); *C04B 35/583* (2013.01); *C04B 35/584* (2013.01); *C04B 35/62857* (2013.01); *C04B 35/62873* (2013.01); *C23C 16/0209* (2013.01); *C23C 16/0254* (2013.01); *C23C 16/045* (2013.01); *C04B 2235/524* (2013.01); *C04B 2235/5244* (2013.01); *C04B 2235/5248* (2013.01); *C04B 2235/5252* (2013.01); *C04B 2235/614* (2013.01); *C04B 2235/616* (2013.01)

(56) References Cited

U.S. PATENT DOCUMENTS

| | | |
|---|---|---|
| 5,965,266 A | 10/1999 | Goujard et al. |
| 6,068,930 A | 5/2000 | Lamouroux et al. |
| 6,284,358 B1 | 9/2001 | Parlier et al. |
| 2004/0105969 A1 | 6/2004 | Huang et al. |
| 2016/0115086 A1 | 4/2016 | Tuertscher et al. |
| 2018/0148381 A1 | 5/2018 | Delehouze et al. |

FOREIGN PATENT DOCUMENTS

| | | |
|---|---|---|
| WO | WO 01/68556 A1 | 9/2001 |
| WO | WO 2006/136755 A2 | 12/2006 |
| WO | WO 2016/102839 A1 | 6/2016 |

METHOD FOR PRODUCING A CONSOLIDATED FIBER PREFORM

CROSS-REFERENCE TO RELATED APPLICATIONS

This application is the U.S. National Stage of PCT/FR2018/050492, filed Mar. 5, 2018, which in turn claims priority to French patent application number 1700224 filed Mar. 7, 2017. The content of these applications are incorporated herein by reference in their entireties.

BACKGROUND OF THE INVENTION

The invention relates to the consolidation of fiber preforms and the manufacture of parts made from a ceramic or at least partially ceramic matrix composite material, hereinafter referred to as CMC material.

One field of application of the invention is the production of parts intended to be exposed during use to high temperatures, in particular in the aeronautic and aerospace fields, particularly pieces of hot aeronautic turbomachine parts, having noted that the invention can be applied in other fields, for example the field of industrial gas turbines.

CMC composite materials have good thermo-structural properties, i.e., high mechanical properties that make them capable of forming structural parts and give them the ability to retain these properties at high temperatures.

The use of CMC materials in place of metal materials for parts exposed to high temperatures during use has therefore been recommended, as long as the CMC materials have a density significantly lower than the metal materials that they replace.

One well-known method for manufacturing parts from CMC material comprises the following steps:
  weaving a fiber texture from fiber layers of carbon or silicon carbide (SiC),
  consolidating a fiber preform by depositing an interphase on the surface of the fibers of the texture made by chemical vapor infiltration (CVI), the fiber texture being maintained in conformation tooling during the CVI,
  injecting a slurry in the fiber preform ("slurry cast" or "slurry transfer molding"),
  infiltrating the preform with a composition with a base of molten silicon so as to form a ceramic matrix, densification process known as MI ("Melt Infiltration") process,
  machining operations,
  forming a coating.

This method for manufacturing CMC parts requires using a conformation tooling during the deposition of the interphase. This type of tooling corresponds to a multi-perforated mold, the inner shape of which makes it possible to conform the fiber texture, and the multiple perforations of which make it possible to set the texture in its geometry while allowing the gaseous phase used during the deposition of the interphase to penetrate the texture and consolidate it. The conformation tooling is for example made of graphite, since this is a material compatible with the reactive atmosphere used during the interphase deposition while being harmless with respect to the carbon or silicon carbide fibers.

This type of conformation tooling, however, has the following drawbacks:
  high cost (machining of purified graphite block),
  fragility (risk of breaking during gripping of the graphite blocks, poor mechanical resistance to forces),
  limited lifetime (dirtying of the multiple perforations and gripping systems),
  frequent need to replace the gripping members of the tooling,
  significant bulk due to the gripping members used to assemble and grip the tooling.

SUBJECT MATTER AND BRIEF DESCRIPTION OF THE INVENTION

The invention in particular aims to provide a solution for consolidating a fiber preform intended to manufacture a part made of composite material not having the aforementioned drawbacks.

This aim is achieved owing to a method for producing a consolidated fiber preform intended for the manufacture of a part made of composite material, comprising the steps of:
  shaping a fiber texture in a heated metal mold, the texture being pre-impregnated with a transient or fugitive material, or shaping a fiber texture in a metal mold and injecting a transient or fugitive material into the fiber texture held in shape in the metal mold,
  cooling the mold,
  removing the set fiber preform from the mold,
  coating the fiber preform with a slurry containing a powder of ceramic or carbon particles,
  heat-treating the coated fiber preform so as to form a porous shell around the fiber preform by consolidation of the slurry and so as to remove the transient or fugitive material present in the fiber preform,
  consolidating the fiber preform by gas-phase chemical infiltration.

The method according to the invention allows a significant reduction in production costs, in particular owing to the use of a metal mold, which has a much greater solidity and lifetime than a graphite conformation tooling, which makes it possible to save on the recurring replacement cost of graphite conformers. The dimensional mastery of the preform is further optimized with shaping in a metal mold relative to a graphite mold. Indeed, the raw final shape of the part (excluding coating) is defined by:
  the metal mold, and
  the overthicknesses or any deformations created by the subsequent manufacturing steps of the part such as vapor phase infiltration, slurry injection ("slurry cast" or "slurry transfer molding") or infiltration with a molten silicon-based composition (Melt Infiltration, or MI) of the preform. Furthermore, once set in shape in the porous shell, the preform can be subjected to subsequent steps for manufacturing a part made of composite material without having to use conformation tooling.

According to a first aspect of the method according to the invention, before the step for consolidating the fiber preform by gas-phase chemical infiltration, piercings are made in the shell. This makes it possible to increase the porosity of the shell and to increase the effectiveness of the infiltrations and/or injections of material in the preform.

According to a second aspect of the method according to the invention, the mold includes a molding cavity having a shape corresponding to the shape of the fiber preform to be produced and one or several channels extending from the molding cavity, the channel(s) being filled with the transient or fugitive material during the injection of the fiber texture into the mold, the transient or fugitive material forming protruding elements on the surface of the preform after removal of said preform, the protruding elements being eliminated during the heat treatment so as to form passage openings in the shell. One thus avoids having to pierce the shell after it is formed when one wishes to increase its porosity. The protruding elements can also be attached or formed on the preform, after it is removed and before it is coated with the slurry intended to form the shell, these elements for example being able to be attached manually or by additive manufacturing on a support, the support here being the consolidated preform.

According to a third aspect of the inventive method, the transient or fugitive material corresponds to a wax to be injected or a fugitive resin.

According to a fourth aspect of the inventive method, the fiber preform is formed by a fiber texture made in a single piece by three-dimensional or multilayer weaving or from a plurality of three-dimensional fiber layers. The fiber texture can in particular be made from fibers of silicon carbide (SiC), silicon nitride ($Si_3N_4$) or carbon (C).

According to a fifth aspect of the inventive method, the step for consolidation by chemical vapor infiltration of the fiber preform comprises depositing an interphase in the preform, the interphase being made up of one of the following materials: pyrolytic carbon (PyC), boron nitride (BN), boron-doped carbon (BC) and silicon carbide (SiC).

The invention also relates to a method for manufacturing a part made of composite material comprising producing a consolidated fiber preform according to the inventive method and, after the step for consolidation by vapor phase infiltration, a step for shaking out the shell, a step for injecting a slurry into the fiber preform and a step for infiltration of the preform with a molten silicon-based composition so as to form a ceramic matrix in said preform.

The invention further relates to a method for manufacturing a part made of composite material comprising producing a consolidated fiber preform according to the inventive method and, after the step for consolidation by vapor phase infiltration, a step for injecting a slurry into the fiber preform and a step for infiltration of the preform with a molten silicon-based composition so as to form a ceramic matrix in said preform.

BRIEF DESCRIPTION OF THE DRAWINGS

Other features and advantages of the invention will appear upon reading the following description of specific embodiments of the invention, provided as non-limiting examples, in reference to the appended drawings, in which.

DETAILED DESCRIPTION OF THE INVENTION

The invention first proposes a method for producing a consolidated fiber preform intended for the manufacture of a part made of ceramic matrix composite (CMC) material, i.e., a material formed by a reinforcement made from carbon or ceramic fibers densified by an at least partially ceramic matrix.

The inventive method is remarkable in that it does not use graphite conformation tooling in order to consolidate the fiber preform by chemical vapor infiltration. As explained hereinafter in detail and according to the invention, the graphite conformation tooling is replaced by a sacrificial shell formed around the shaped fiber texture, the shell making it possible to maintain the shaping of the fiber texture during its consolidation by chemical vapor infiltration.

One embodiment of a CMC material according to the inventive method will be described in reference to FIGS. 1 to 13.

Figure 1:
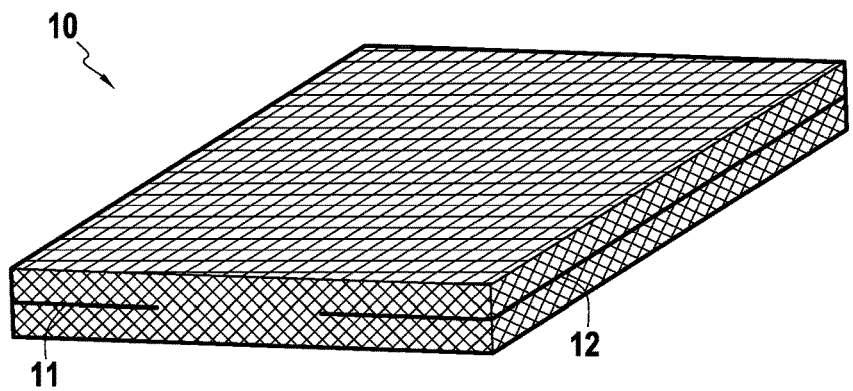
FIGS. 1 to 8 are schematic views showing the consolidation of a fiber preform according to one embodiment of the invention.
Figure 2:
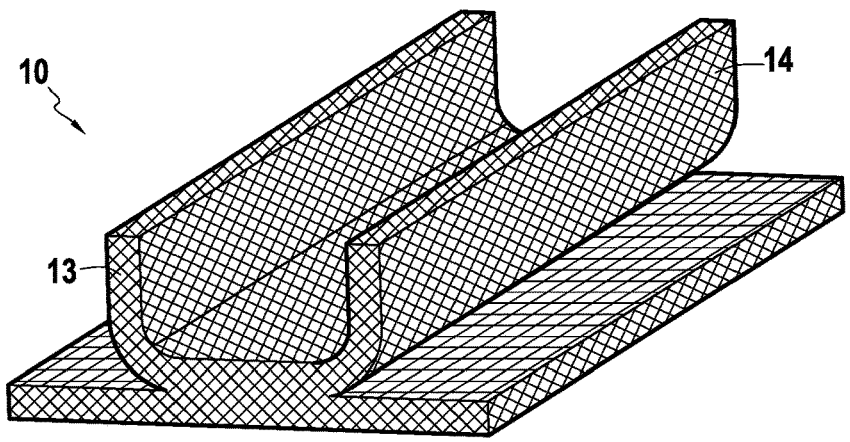

A first step S1 (FIG. 13) consists of producing a fiber texture 10 from which a fiber preform having a shape close to that of a part to be manufactured will be made (FIG. 1). Such a fiber texture can be obtained by multilayer or three-dimensional weaving from wires or cables. It is also possible from two-dimensional fiber textures such as fabrics or bundles of wires or cables to form layers that will next be draped on a shape and optionally bonded to one another, for example by sewing or implantation of wires. In the example described here, the fiber texture 10 is intended to form a turbine ring sector made from CMC material in the shape of Pi or inverted π with an annular base from which two hooking tabs extend. To that end, the fiber texture 10 is made by three-dimensional weaving of silicon carbide or carbon with disconnection zones 11 and 12 being arranged that make it possible to separate the texture parts 13 and 14 corresponding to the hooking flanges of the ring sector (FIG. 2).

The weaving can be of the interlock type, as illustrated. Other three-dimensional or multilayer weaves can be used, for example multi-cloth or multi-satin weaves. Reference may in particular be made to document WO 2006/136755.

The fibers making up the fiber texture are preferably ceramic fibers, for example fibers essentially formed by silicon carbide SiC (hereinafter referred to as SiC fiber) or silicon nitride $Si_3N_4$. It is in particular possible to use SiC fibers marketed under the names "Tyranno ZMI," "Tyranno Lox-M" and "Tyranno SA3" by the Japanese company Ube Industries, Ltd or "Nicalon," "Hi-Nicalon" and "Hi-Nicalon (S)" by the Japanese company Nippon Carbon. In a variant, it is possible to use carbon fibers.

In a known manner, in the case of ceramic fibers, in particular SiC fibers, a surface treatment of the latter before the formation of an interphase deposit is preferably done to eliminate overspraying and a superficial oxide layer such as silica $SiO_2$ present on the fibers.

Figure 3:
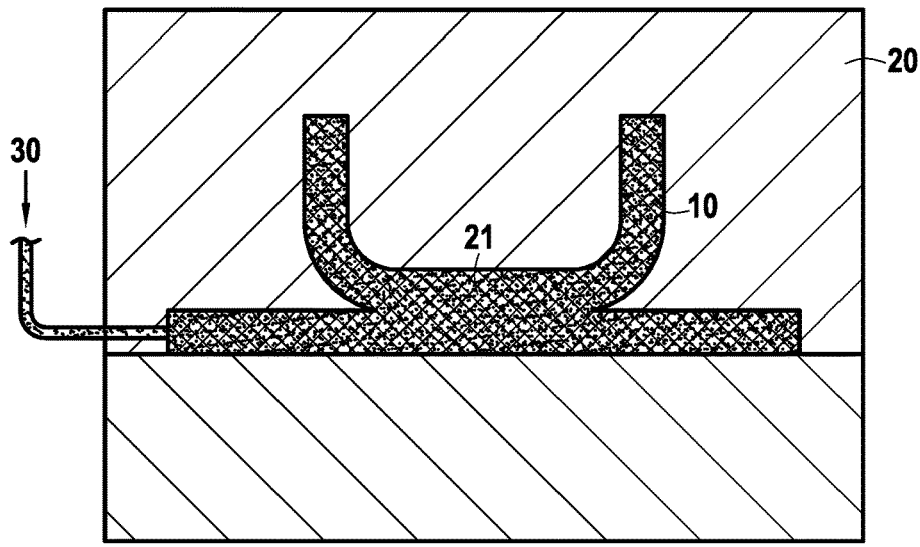

The following steps consist of maintaining the shaping of the fiber texture in a metal mold 20 and setting the latter to obtain a preform having a shape close to that of the part to be manufactured (FIG. 3). To that end, the fiber texture 10 is placed in the metal mold 20, the molding cavity 21 of which corresponds to the shape of the part to be manufactured (step S2), a transient or fugitive material 30 being injected into the texture thus kept in shape (step S3) (FIG. 3). According to one embodiment variant, the fiber texture 10 can be impregnated with a transient or fugitive material (step S4) before it is shaped in the metal mold (step S5). The transient or fugitive material preferably has a melting and evaporation temperature significantly higher than the ambient temperature (20° C.±5° C.), for example at least 50° C. higher than the ambient temperature (20° C.±5° C.). The transient or fugitive material can in particular be made from an injectable wax or a transient resin, for example an acrylic PMMA resin or a polyvinyl alcohol (PVA) resin.

Figure 4:
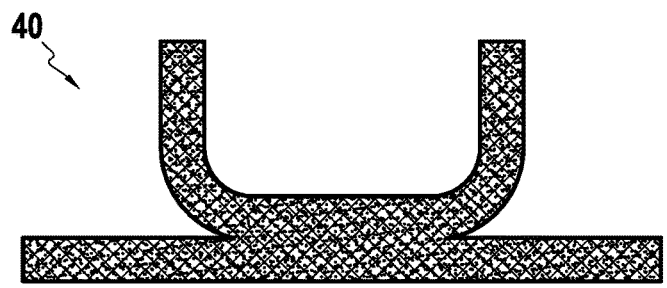
Figure 5:
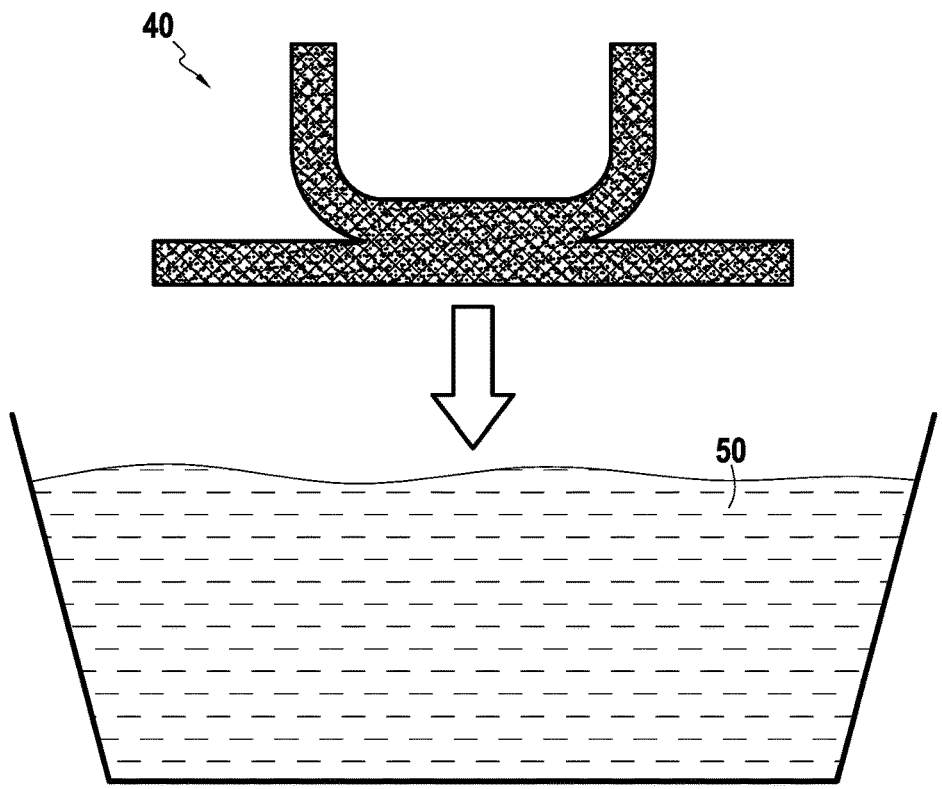
Figure 6:
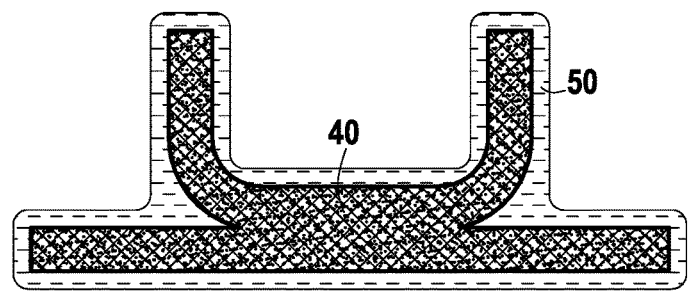

After cooling of the metal mold, a fiber preform 40 is removed, the preform being set and self-supporting owing to the presence of the transient or fugitive material in solid state therein (step S6, FIG. 4).

The fiber preform 40 thus made is coated with a slurry 50 containing a powder of ceramic or carbon particles (step S7). The powder can be made from one or several of the following elements: oxide-type particles (silica, alumino-silicate, etc.), silicon carbide particles with or without colloidal silica, carbon particles. The coating of the fiber preform can be made by soaking the latter in a slurry bath 50 (FIG. 5) or by any other techniques known by one skilled in the art (soaking, sprinkling, coating, spray coating, etc.). An assembly of several preforms in a cluster can be considered in order to increase the production rhythms and reduce the unit production cost of the parts.

Figure 7:
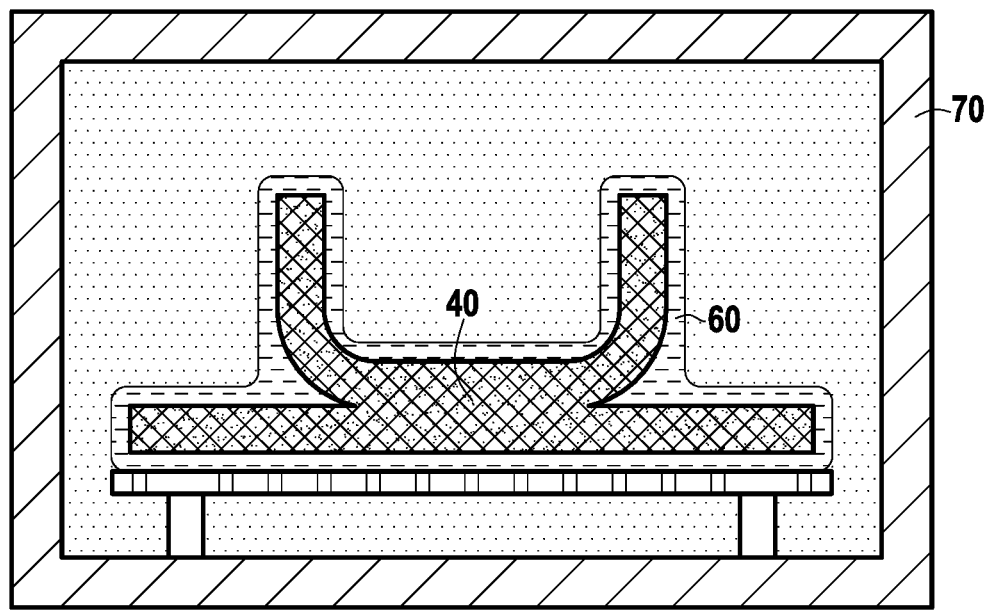

The fiber preform 40 thus coated by a layer of slurry 50 (FIG. 6) undergoes a heat treatment in a furnace 70 in order to sinter or pre-sinter the particles present in the slurry so as to consolidate the layer of slurry present on the surface of the preform 40 and form a shell 60 around the preform 40, the shell 60 thus formed being porous (step S8, FIG. 7). In a known manner, the rate of particles and/or the size of the particles are adjusted so as to obtain a shell having a porosity array compatible with a consolidation of the preform by gaseous route. The removal of the transient or fugitive material of the preform 40 is also done during this step, the heat treatment being done at a temperature above the melting and/or evaporation temperature of the transient or fugitive material.

Vents making it possible to facilitate the discharge of the transient or fugitive material can be arranged in the shell surrounding the preform. These vents can be arranged during the coating of the preform with the slurry by masking certain parts of the preform and forming passages in the shell once the consolidation heat treatment is done. The vents can also be machined in the shell after it is formed. These vents may optionally be plugged up again after the transient or fugitive material is eliminated.

Figure 8:
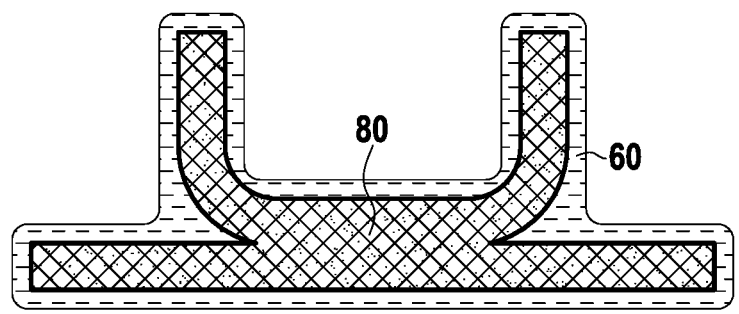

One thus obtains a preform 80 corresponding to the preform 60 in which the porosity array present between the fibers has been reopened by the removal of the transient or fugitive material, the geometry of the preform 80 in turn being maintained owing to the presence of the shell 60 (FIG. 8). The shell 60 is porous and therefore compatible for a chemical vapor infiltration of the preform 80.

Optionally, perforations can be made in the shell in order to increase the porosity of the shell and thus facilitate the passage of the infiltration gases (step S9).

Figure 11:
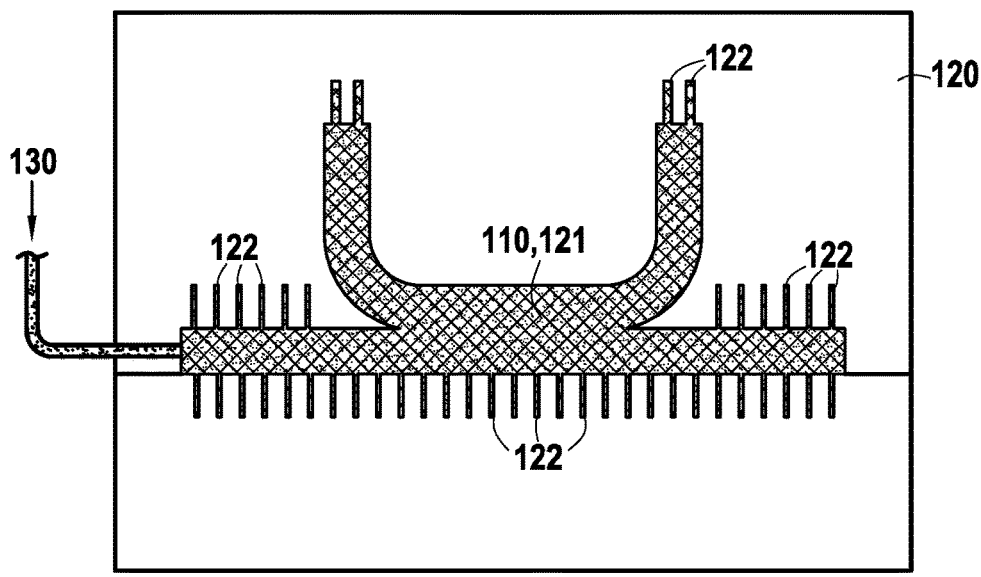
FIGS. 11 and 12 are schematic sectional views showing the embodiment of segments on the surface of a consolidated fiber preform according to one embodiment variant of the invention.
Figure 12:
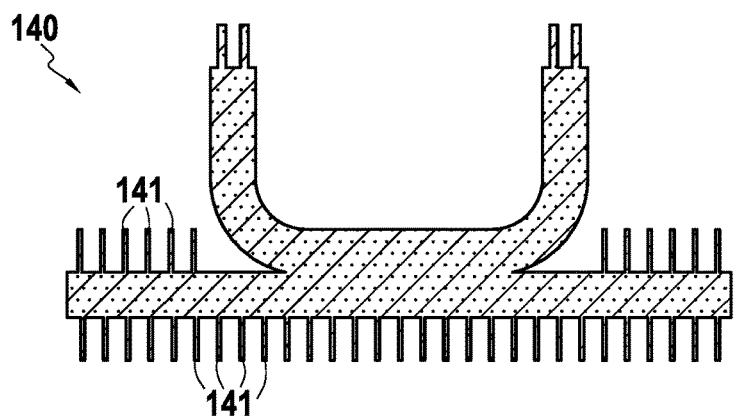
Figure 13:
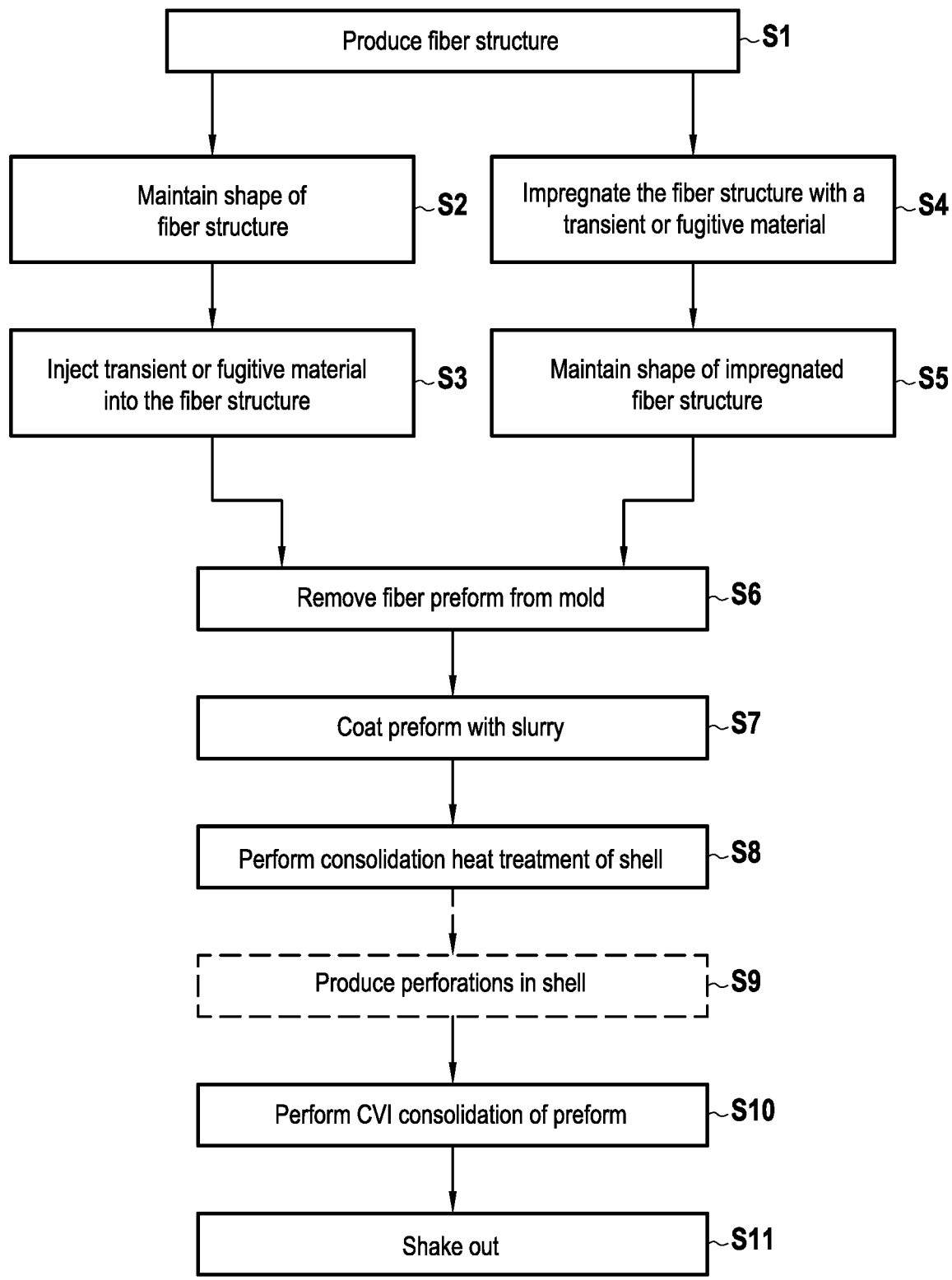
FIG. 13 is a flowchart of steps of a method for consolidating a fiber preform according to one embodiment of the invention.

Passage holes can also be made during the formation of the shell. To that end, as illustrated in FIG. 11, a metal mold 120 is used that includes, aside from a molding cavity 121 corresponding to the shape of the part to be manufactured, a plurality of channels 122 extending to the periphery of the molding cavity 121 and communicating therewith. Thus, during the injection of a transient or fugitive material 130 into the mold 12, the latter will fill in not only the porosity present in the fiber texture 110 maintained in the molding cavity 121, but also the channels 122. After cooling and removal, one obtains, as shown in FIG. 12, a preform 140 that has, on its surface, a plurality of tips or spurs 141 made from transient or fugitive material that will make it possible to reserve passages during the later coating of the preform with the slurry. The segments 141 are next eliminated during the consolidating heat treatment of the slurry so as to form holes or passages in the formed shell. One thus avoids having to pierce the shell after it is formed. The segments can have varied shapes, in particular non-rectilinear shapes, making it possible to define different circulation geometries for the gases in the shell.

Figure 9:
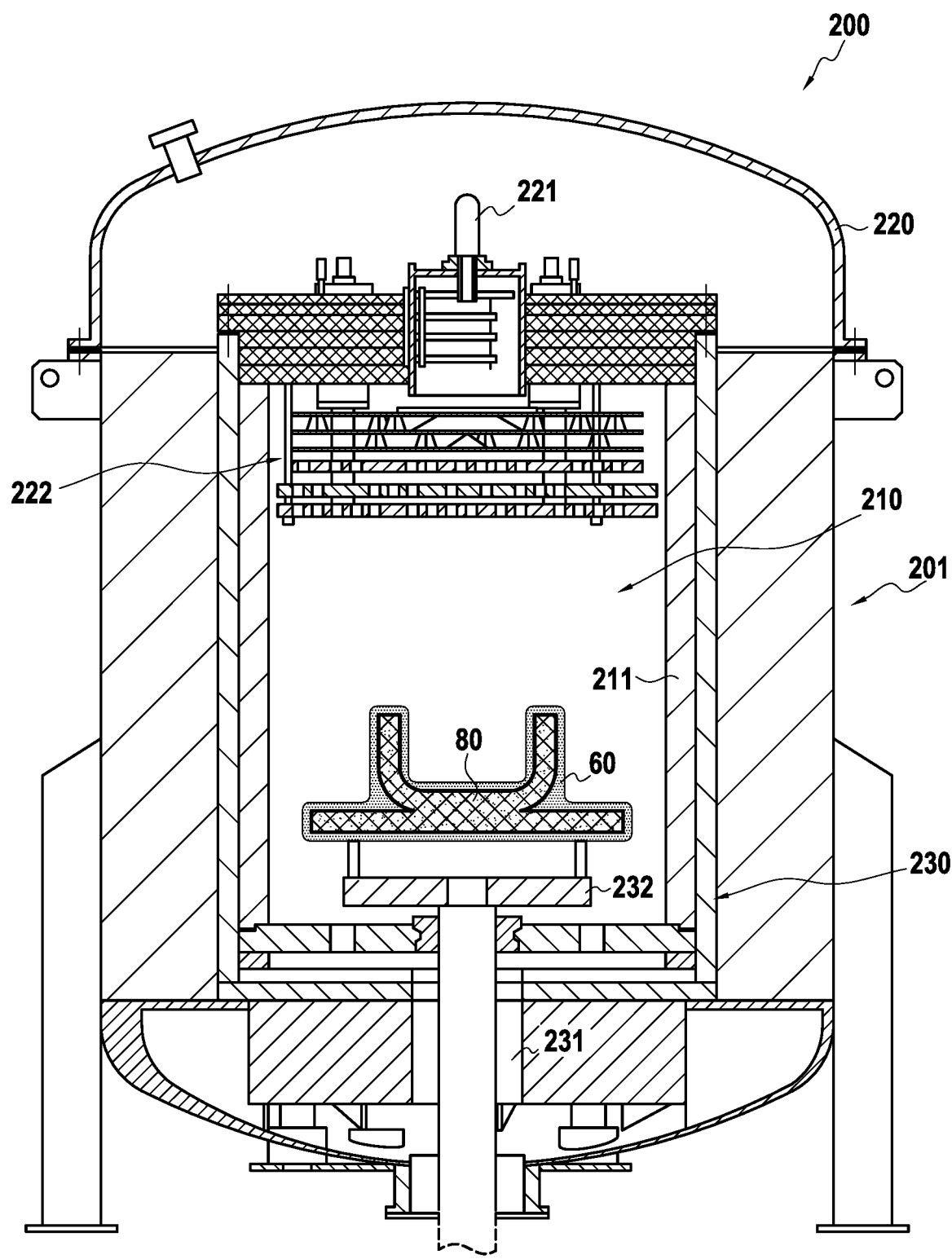
FIG. 9 is a schematic sectional view of a vapor phase infiltration facility used for the densification of a fiber preform.

Once the shell is formed, with or without additional perforations or passages, the consolidation is done by vapor phase infiltration of the fiber preform (step S10). To that end, as illustrated in FIG. 9, the preform 80 maintained inside the shell 60 is placed in a chemical vapor infiltration facility or furnace 200. In a manner known in itself, the chemical vapor infiltration facility 200 comprises a cylindrical enclosure 201 delimiting a reaction chamber 210 whereof the upper part is closed by a removable cover 220 provided with a gas intake pipe 221 that opens into a preheating zone 222 making it possible to heat the gas before it is diffused in the reaction chamber 210 containing the preform(s) to be densified. The residual gases are extracted at the bottom 230 of the facility by a discharge pipe 231 that is connected to suction means (not shown). The bottom 230 includes a support 232 on which the preform 40 surrounded by the shell 60 is intended to be deposited.

The heating in the preheating zone as well as inside the reaction chamber 210 is produced by a graphite susceptor 211 forming an armature electromagnetically coupled with an inductor (not shown).

The preform 80 is consolidated by chemical vapor infiltration. In order to ensure the consolidation of the preform, a reactive gas containing at least one or several precursors of the material of a consolidation interphase is introduced into the reaction chamber 210. The interphase deposited into the preform can in particular be made from pyrolytic carbon (PyC), or boron nitride (BN), or boron-doped carbon (BC) (with 5 at % to 20 at % boron, the rest being carbon), or silicon carbide. The thickness of the deposited interphase is preferably between 100 nm and 1500 nm. The total thickness of the interphase and the first matrix phase is chosen to be sufficient to consolidate the fiber preform, i.e., to bond the fibers of the preform to one another enough that the preform can be manipulated while preserving its shape without assistance from maintaining tooling. This thickness can be at least equal to 500 nm. After consolidation, the preform remains porous, the initial porosity for example only being filled in for a minority portion by the interphase and the first matrix phase.

The performance of PyC, BC, $B_4C$, Si—B—C, $Si_3N_4$, BN and SiC depositions by CVI is known. Reference may in particular be made to documents U.S. Pat. Nos. 5,246,736, 5,738,951, 5,965,266, 6,068,930 and 6,284,358.

Figure 10:
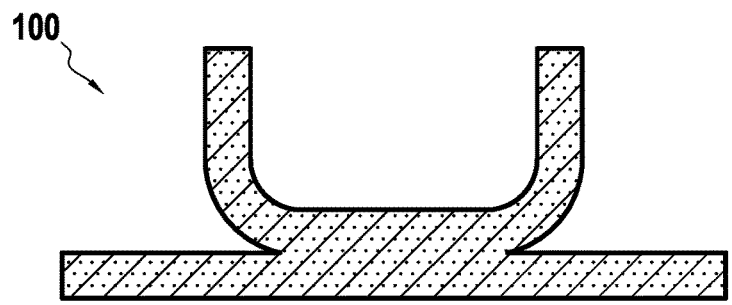
FIG. 10 is a sectional schematic view of a consolidated fiber preform according to one embodiment of the invention.

Once the consolidation is complete, the shaking out of the shell is done, the latter being destroyed mechanically in order to free, as illustrated in FIG. 10, a preform 100 corresponding to the consolidated preform 80 (step S11). The preform 100 is self-supporting and does not require any shape maintaining tooling for the subsequent operations. The preform 100 can in particular undergo the subsequent steps for manufacturing a part made of a CMC material, namely:

injecting a slurry in the fiber preform ("slurry cast" or "slurry transfer molding"), infiltrating the preform with a composition with a base of molten silicon so as to form a ceramic matrix, densification process known as MI ("Melt Infiltration") process, machining operations, forming a coating.

In an embodiment variant, the shell can be kept during operations for injecting a slurry and infiltration with a molten silicon-based composition.

One exemplary embodiment of a consolidated fiber preform intended to manufacture a part made of a CMC composite material according to a method according to the invention is given below:

producing a fiber texture by three-dimensional weaving of the interlock type of SiC fibers, impregnating the fiber texture with polyvinyl alcohol (PVA), shaping the fiber texture in a heated metal mold, cooling the mold, removing the set fiber preform from the mold, coating the fiber preform with a slurry containing a mixture of colloidal particles of Sic at 85 at % at $SiO_2$ at 15 at %, drying the coated preform at 150° C. for 2 hours, sintering particles coating the fiber preform at 1000° C. for 1 hour, consolidating the fiber preform by gas-phase chemical infiltration with or on nitride (BN) deposited therein at a temperature between 700° C. and 900° C.

The invention claimed is:

1. A method for producing a consolidated fiber preform intended for the manufacture of a part made of composite material, comprising:

shaping a fiber texture in a heated metal mold, the texture being pre-impregnated with a transient or fugitive material, or shaping a fiber texture in a metal mold and injecting a transient or fugitive material into the fiber texture held in shape in the metal mold, cooling the mold, removing the set fiber preform from the mold, coating the fiber preform with a slurry containing a powder of ceramic or carbon particles, heat-treating the coated fiber preform so as to form a porous shell around the fiber preform by consolidation of the slurry and so as to remove the transient or fugitive material present in the fiber preform, and consolidating the fiber preform by gas-phase chemical infiltration.

2. The method according to claim 1, wherein, before the step for consolidating the fiber preform by gas-phase chemical infiltration, piercings are made in the shell.

3. The method according to claim 1, wherein the mold includes a molding cavity having a shape corresponding to the shape of the fiber preform to be produced and one or several channels extending from the molding cavity, the one or several channels being filled with the transient or fugitive material during the injection of the fiber texture into the mold, the transient or fugitive material forming protruding elements on the surface of the preform after removal of said preform, the protruding elements being eliminated during the heat treatment so as to form passage openings in the shell.

4. The method according to claim 1, further comprising, after the step for removing the preform from the mold and before the step for coating the preform with a slurry, forming protruding elements on the surface of the preform.

5. The method according to claim 1, wherein the transient or fugitive material corresponds to a wax to be injected or a transitory resin.

6. The method according to claim 1, wherein the fiber preform is formed by a fiber texture made in a single piece by three-dimensional or multilayer weaving or from a plurality of three-dimensional fiber layers.

7. The method according to claim 1, wherein the fiber texture is made from fibers of silicon carbide, silicon nitride or carbon.

8. The method according to claim 1, wherein the step for consolidation by chemical vapor infiltration of the fiber preform comprises depositing an interphase in the preform, the interphase being made up of one of the following materials: pyrolytic carbon, boron nitride, boron-doped carbon and silicon carbide.

9. A method for manufacturing a part made of composite material comprising producing a consolidated fiber preform according to claim 1, the manufacturing method further comprising, after the step for consolidation by vapor phase infiltration, a step for shaking out the shell, a step for injecting a slurry into the fiber preform and a step for infiltration of the preform with a molten silicon-based composition so as to form a ceramic matrix in said preform.

10. A method for manufacturing a part made of composite material comprising producing a consolidated preform according to claim 1, the manufacturing method further comprising, after the step for consolidation by vapor phase infiltration, a step for injecting a slurry into the fiber preform and a step for infiltration of the preform with a molten silicon-based composition so as to form a ceramic matrix in said preform.

* * * * *